United States Patent
Rathsmann (10) Patent No.: US 9,678,112 B2
(45) Date of Patent: Jun. 13, 2017

(54) METHOD AND DEVICE FOR MEASURING ELECTRIC CURRENTS BY MEANS OF A CURRENT TRANSFORMER

(76) Inventor: Stefan Rathsmann, Leipzig (DE)

(*) Notice: Subject to any disclaimer, the term of this patent is extended or adjusted under 35 U.S.C. 154(b) by 89 days.

(21) Appl. No.: 14/232,290

(22) PCT Filed: Jul. 12, 2012

(86) PCT No.: PCT/DE2012/000697
§ 371 (c)(1),
(2), (4) Date: Feb. 17, 2014

(87) PCT Pub. No.: WO2013/007240
PCT Pub. Date: Jan. 17, 2013

(65) Prior Publication Data
US 2014/0159704 A1    Jun. 12, 2014

(30) Foreign Application Priority Data

Jul. 14, 2011    (DE) .................. 10 2011 107 721

(51) Int. Cl.
G01R 15/18    (2006.01)
(52) U.S. Cl.
CPC .......... *G01R 15/183* (2013.01); *G01R 15/185* (2013.01)
(58) Field of Classification Search
CPC .. G01R 15/183; G01R 19/00; G01R 19/0092; G01R 15/18
USPC .............................. 324/117, 117 R
See application file for complete search history.

(56) References Cited

U.S. PATENT DOCUMENTS

| | | | | |
|---|---|---|---|---|
| 4,847,554 A | * | 7/1989 | Goodwin | H01F 27/427 324/119 |
| 6,160,697 A | * | 12/2000 | Edel | G01R 15/185 361/143 |
| 8,214,200 B2 | * | 7/2012 | Cabot | G06F 17/147 704/201 |

* cited by examiner

*Primary Examiner* — Melissa Koval
*Assistant Examiner* — Rahul Maini
(74) *Attorney, Agent, or Firm* — Ramin Amirsehhi; David P. Owen; Hoyng Rokh Monegier LLP

(57) ABSTRACT

A method and a device for measuring electrical differential currents, which in addition to the alternating current component also contain a direct current component, by means of an inductive differential current transformer.

The known methods for measuring mixed currents require special current transformer designs with respect to the coil winding and magnetic core material and core number. The new method copes with the same current transformers that are common for measuring pure differential alternating currents.

According to the invention, the secondary coil (3) of the current transformer is controlled such that the magnetic flux ($\phi$) linked with the secondary coil (3) inside the core remains constant, irrespective of the differential current and the secondary current (Is) required for this is measured. For this, on the one hand, the ohmic resistor (Rcu) of the secondary coil (3) is compensated in the secondary circuit (4) by an electronically produced, negative resistor (Rz), and on the other hand a defined magnetic flux is periodically restored, in that the saturation flux ($\phi$s) of the core is used as a reference point.

13 Claims, 8 Drawing Sheets

METHOD AND DEVICE FOR MEASURING ELECTRIC CURRENTS BY MEANS OF A CURRENT TRANSFORMER

CROSS REFERENCE TO RELATED APPLICATION

This application is a 35 U.S.C. 371 National Phase Entry Application from PCT/DE2012/000697, filed Jul. 12, 2012, which claims the benefit of German Patent Application No. 10 2011 107 721.2 DE filed on Jul. 14, 2011, the disclosure of which is incorporated herein in its entirety by reference.

BACKGROUND

The invention relates to a method and a device for measuring electric currents by means of a current transformer. In particular, the invention relates to a method and a device for measuring the electric differential currents which, in addition to the alternating component, also contain a direct current component, and are thus mixed currents. The measurement of differential currents and/or residual currents is a major concern in the field of safety engineering of industrial plants and electrical equipment, in particular for the protection of people against electric shocks, but also for the protection of machinery, industrial equipment and electrical equipment against malfunction and damages due to unwanted or faulty current flows. An example of a possible occurrence of such unwanted current flows is so-called ground faults. In the case of a ground fault, an electric conductor forms an unintentional electrical connection to the ground potential, that is, there is a low electrical resistance between conductor and ground potential. Electric current, residual current or differential current flows across this resistance. This presents a problem and a major hazard when thresholds are exceeded during the operation of electrical equipment.

To prevent such a hazard, the existence and the magnitude of differential or residual currents within the device are determined. In the case of a residual current, one distinguishes between the smooth DC residual current and the pulsating DC residual current as well as the AC residual current. Inductive current transformers or summation transformers are used to detect alternating residual current. An inductive current transformer or summation transformer generally comprises a ferromagnetic transformer core, on which a transformer coil, for example a coated copper wire, is disposed as a secondary winding. To detect, for example, a differential current, the supply line and return line of the circuits of the electrical device in question are combined and guided together in parallel through a current transformer. The electrical supply line and the return line together form the primary winding of the current transformer, whereby the primary winding does not necessarily have to wrap around the ferromagnetic transformer core repeatedly or once, but can generally consist of conductors fitted in a straight manner through the middle of the transformer core. To be more specific, the simply pushed-in conductors are exactly one winding that closes at a great distance from the transformer core.

When an electric device functions properly, i.e., when the electrical resistance between electrical conductors and the ground potential is sufficiently great, the sum of the currents in the electrical supply and return lines through the current transformer will cancel out and the current transformer will not output any signal. In the presence of undesirable current flows in the electrical device, however, a finite differential current will be measured.

As with transformers, inductive current transformers are only sensitive to alternating electric currents, whereby, without further measures, a direct current does not output a suitable signal. In practice, however, since the measurement of the direct current component of the differential current is of primary interest, for example, due to increased risk of direct current to humans, different devices comprising current transformers have been proposed, which are also capable of measuring the direct current component of differential currents.

From DE102005028881 B4, a residual current analyzer for detecting residual currents and a device with inductive summation current transformers for detecting AC residual current and pulsating direct current is known, in which by means of the filtering and splitting of the detected differential current signal into low-frequency and high-frequency sub-signals and their analysis, residual currents can be detected which can usually not be detected with such inductive summation current transformers. Furthermore, a calibration of the residual current analyzer through feeding a specifically adjustable and known residual current through an additional winding on the summation current transformer is proposed. However, the measured direct current is not smooth.

DE 102 37 342 A1 discloses a method and a device for monitoring residual current in alternating current networks, in which current sensors are used to detect the currents and digitize them; subsequently, the summation current is calculated. In dependence on the phase position for the voltage, the summation current is divided into the active and reactive current components, enabling a frequency-dependent weighting of the sum of currents which corresponds to the residual alternating current. Residual direct currents can be detected only when using direct current sensors. To measure a relatively small differential current, for example 10 A+(−9.99 A)=10 mA, very accurate and expensive current sensors are required in order to make a practical implementation possible at all.

Furthermore, methods for the measurement of mixed currents and especially smooth DC residual currents using inductive current transformers are known, which utilize the non-linearity between magnetic flux density B and field strength H according to the hysteresis and/or magnetization curve B(H) of the ferromagnetic transformer core. More particularly, the fact is utilized that the transformer core at an increasing flow of current through the primary conductor thus reaches saturation, thereby flattening the increase of the magnetization curve B(H) towards higher primary currents and thus resulting in a dependency of the permeability from the current flowing through the primary conductor. In terms of measurement technology, it therefore determines the instantaneous value of the existing differential current, the point on the magnetization curve of the transformer core that is assumed, whereby the rise dB/dH of the point occupied on the magnetization curve determines the differential inductance of the coil in the secondary circuit of the current transformer, which is then measured by means of suitable circuits.

In DE19943802 and/or EP1212821, the principle of controlled inductance is used. Changes in coil inductance are thereby detected on the basis of the detuning of a resonant circuit. In DE19943802, the principle of the transducer circuit is used, whereby the differential current acts as a control current of the transducer. When a DC residual current exists, the iron core magnetization shifts and changes the coil inductance. Changes in coil inductance are thereby detected on the basis of the detuning of a resonant circuit. Further examples of the application of the principle of controlled inductance are described in DE3642393 A1 and DE3543985 A1.

It is also known to use a coil as an applied inverting and frequency-determining component of a multivibrator. This creates a rectangular alternating voltage on the coil such that the ferromagnetic transformer core always oscillates back and forth between its two saturation magnetic fluxes. A magnetization current thereby flows through the coil. With a suitable form of the magnetization curve of the material of the transformer core it can be achieved in such a device in that the magnetic flux field traversed by the transformer core is almost independent of the instantaneous value of the differential current. It follows that each magnetic voltage generated by the differential current over the transformer core is compensated by a magnetic offset voltage generated by coil. The magnetization current of the multivibrator is superimposed on a counter current proportional to the differential current, which is then measured by means of suitable circuits.

DE19826410 A1 shows the basic circuit of an all-current sensitive differential current sensor, whereby the multivibrator is realized with two applied coils.

In EP1267467 A2, a modulating oscillation circuit is described which comprises a multivibrator with a coil. Here, a resistor in the magnetization circuit brings about that the counter-current influences the pulse-width ratio of the generated rectangular alternating voltage. However, it is set out in EP1267467 A2 that in the described method through high-frequency differential current components a violation of the sampling theorem of Shannon can occur. According to that solution it is proposed that the magnetic voltage generated by the high-frequency differential current components in the transformer core, for example, of the multivibrator be compensated by an opposite magnetic voltage. The opposite voltage is generated by an additionally applied coil that is connected to an additional, inductively operating transformer via a high pass filter. Through this measure, aliasing effects between the high-frequency differential current components and the multivibrator frequency are avoided in the multivibrator.

DE 3 534 985 A1 and DE 3 543 948 B1 disclose a residual current circuit breaker for detecting universal current consisting of two summation current transformers. Hereby a summation current transformer transforms pulsating and alternating currents and a second summation current transformer detects direct current.

From DE29705030 a residual current circuit breaker for detecting universal current with a summation current transformer is known. Here, a summation current transformer with two separate evaluation circuits for pulsating and/or alternating and direct current are provided, which are operated by clocks or filters. In this case, the current transformer is either operated alternately over clock pulses with the evaluation circuits or connected simultaneously via filters with two evaluation circuits.

A disadvantage of the known solutions with inductive current transformers is that the measurement of the DC residual current is indirectly effected by evaluating the alternating current component, whereby changes in inductance are determined. This leads to complications in the evaluation and the connection circuit. In addition, increased requirements in terms of coil winding and core materials are to be met. Moreover, the amount of wiring for the described current transformer for detecting mixed currents is often higher than for detecting alternating currents. In some embodiments, part of the measurement electronics is housed in the transformer housing, which requires the power supply. Other versions operate with two coils on the transformer core and require a four-wire connection.

This all limits the possibility to retrofit already available or already built-in current transformers that are used to detect alternating current to detect mixed current.

Furthermore, a measurement of mixed currents in the ampere range can alternatively also be realized with the aid of Hall current transformers, wherein the Hall element is located in the air gap of a ferromagnetic iron core. A current in the primary conductor surrounded by a core leads to a magnetic flux through the Hall element and an evaluable Hall voltage. Often Hall current transformers work according to the principle of compensation. For this, a coil is disposed on the transformer core. This is controlled by a control circuit connected with the Hall element such that the magnetic flux through the Hall element is always equal to zero. Each magnetic voltage generated by the enclosed primary conductor is compensated by a counter voltage. The necessary countercurrent needed for this is proportional to the current of the primary conductor and is the output signal of such transformers.

Hall current transformers are not suitable for measuring differential currents, which can lie in the 10 mA range. The object of the invention is to provide a suitable measuring method for mixed currents and a corresponding measuring device that works with the same current transformers that are commonly used for measuring AC residual currents.

DISCLOSURE OF THE INVENTION

According to the invention, a method and a corresponding device for measuring currents according to the independent claims are provided.

An idea underlying the invention, advantageously implemented can be seen in that the compensation principle applied to Hall current transformers is transferred to inductive current transformers. The magnetic flux, i.e., the magnetic flux concatenated to the coil is therefore automatically kept constant irrespective of the occurring differential current and in order to measure the equivalent countercurrent through the coil. This allows the direct current and the alternating current component of the differential current to be determined on the basis of the secondary direct current.

In the method according to the invention, the ohmic resistor of the coil is compensated by means of a negative ohmic resistor forming a controllable active dipole in the secondary circuit of a current transformer, so that the direct current component of a secondary current induced by a primary current is maintained in the secondary coil. Furthermore, to produce a defined magnetic flux in the transformer core, a predetermined pulse sequence is coupled in via the coil, wherein the transformer core is magnetized by applying a first voltage pulse or a current to a coil of the transformer until the saturation flux occurs. Subsequently, the reversed polarity and defined voltage-time area of the magnetic flux is reduced again by applying a further voltage pulse.

A device for measuring electric currents is also provided, which is adapted for coupling to the secondary terminals of the coil of a current transformer and, in conjunction with the current transformer, for establishing the method according to the invention.

Further, a system for measuring electrical currents is provided, having a current transformer and the device according to the invention.

To put it more clearly, according to an inventive principle by means of an electronic circuit, an active dipole is formed, having the behavior of a negative ohmic resistor in respect to voltage and current, wherein this dipole is connected to the coil and dimensioned and controlled via the measured signal such that the amount of its negative resistance corresponds to the ohmic coil resistor Rcu. The ohmic total resistance Rg from the series circuit of the coil and dipole becomes zero. It is due to this resistance compensation that the coil on the core almost like an ideal conductor and counteracts every temporal change in the magnetic flux concatenated with it.

The effect of the invention can be discussed based on the formula that comprises the time characteristic of a direct current in a circuit of an inductor and an ohmic resistor. For the secondary circuit the formula has the following form:

$$Is(t) = Is_0 \cdot e^{-\frac{1}{T}} \qquad (1)$$

with $$T = \frac{Ls}{Rg}$$

and $$Rg = Rcu + Rz$$

Here, $Is_0$ is the initial value of the secondary direct current, Ls the coil inductance, Rcu the ohmic resistor of the secondary coil, Rz the negative dipole resistor and T the time constant of the circuit. Due to the resistance compensation of the present invention, the ohmic total resistance of the secondary circuit Rg approaches zero, and thus the time constant T approaches infinity, so that the exponential function for a finitely large time t retains the value 1. Since the inductance is part of a transformer and there is an inductive coupling to the primary core enclosed by the transformer, the initial value of the secondary direct current Is0 is the transformed differential current. If initially Is=0 and then the differential direct current begins to flow, a secondary direct current occurs, which does not decrease because of the infinite time constant.

By means of the described resistance compensation according to the invention, it can be advantageously and reliably ensured that from the measured secondary current of the current transformer, the correct magnitude of the actual secondary direct current and/or counter-current corresponding to the mixed residual current of the primary conductors can be determined.

This is achieved in particular by the pulse sequence of voltage pulses according to the invention, which is coupled in via the coil during periodic measurement periods. Through the pulse sequence a defined magnetic flux is established in the transformer core, by first applying a direct current voltage in the form of a voltage pulse to the coil until the transformer core has safely reached its saturation magnetic flux or flux saturation, which then presents a reference point; since, in saturation, the magnetization curve of the core material is very flat (dB/dH low) and the saturation flux is thus nearly independent of the differential and the secondary current. According to the invention, starting from this reference point, plus a small time delay by application of a voltage pulse of reverse polarity and defined voltage-time area, a defined magnetic flux is established, whereby a residual magnetic flux is provided. The method according to the invention is therefore made independent of the starting time, and only then applicable in practice: since the resistance compensation must be activated at a certain time at which a differential current can flow, for instance the time at which the device according to the invention starts. From this point onwards, the sole application of resistance compensation of the magnetic flux in the transformer core would remain constant but unknown. To be more precise, the secondary current would in the characteristic of time not accurately correspond to the interesting countercurrent producing the magnetic offset voltage for the differential current. Rather, the secondary current is the sum of the countercurrent and a magnetization direct current which maintains the existing magnetic flux against the magnetic resistance of the core. According to the invention, this magnetization direct current corresponds to the residual magnetic flux, i.e. the produced magnetic flux and will hereinafter be referred to as a residual current.

The invention is suitable for the measurement of mixed currents of high amperage as well as in the area, for example, of less than 10 mA. One skilled in the art recognizes that the invention is advantageously applicable to a large number of different transformers. In particular, the invention is applicable for standard transformers for differential current measurement, which have usually a core of highly permeable soft magnetic material and a secondary coil with 500 to 1000 turns with two-wire connection. These are offered by many manufacturers in a variety of shapes so that a large assortment is available. In electrical installations, systems for monitoring AC residual current often already exist, and it would take little effort to expand to monitoring and detecting mixed current while retaining the standard transformer. Thus, the invention leads to lower costs and ultimately allows for broader use of monitoring networks with technically increasing proportion of mixed currents.

Advantageous embodiments of the invention are apparent from the description and the appended dependent claims.

According to an embodiment of the invention, the voltage-time area of the further voltage pulse is selected such that, and following a further voltage pulse, a defined third voltage pulse is applied to the further voltage pulse with opposite polarity so that an operating point is attained, in the transformer, in which, with a small magnetization current in relation to the saturation current, the differential inductance of the transformer is as large as possible.

Thus, a demagnetization sequence is run which, due to the three special voltage pulses, achieves an optimum setting of residual current and residual magnetic flux. As a result, the measurement sensitivity can be further increased.

According to a further development of the invention, the magnetization current, which corresponds to the magnetic flux produced as defined in the coil, is determined in a manner in which the pulse sequence is applied alternately with a predetermined frequency with respectively opposite sign, for both saturation polarities. Then, the amplitude of the resulting rectangular alternating magnetization current is determined.

Thus, the method is applied repeatedly in a convenient manner and the measuring accuracy can be increased. This will also be convenient because defined interval lengths exist due to the applied frequency. In addition, data with both positive and negative polarity are obtained, which then further increase the overall achievable precision.

Measuring cycles with a cycle time are preferably formed periodically, which in each period has a time interval with demagnetization and a time interval with measuring time.

According to an advantageous embodiment of the invention, a measurement signal is determined, which is selectively taken from the electric current flowing in the secondary circuit of the transformer or from the voltage drop in the secondary circuit of the transformer.

Through this, further signal information can be provided advantageously, which are analyzed, for example, for their chronological characteristics, which the measured result has improved.

The measurement signal can, for example, be determined or generated by means of a filter.

According to a development of this advantageous embodiment, the amplitude of the resulting rectangular magnetization alternating current is determined and a correction signal generated, which corresponds to the characteristic and amplitude of a rectangular magnetization alternating current and the measurement signal can be corrected by subtracting the calculated correction signal.

Through this, it can be achieved in a convenient manner that the method is carried out largely independently of a specimen tolerance, a temperature dependence of the transformer core, etc. Thus, since the residual current is explicitly determined during current measurement, the systematic error is reduced. As a result of this residual current compensation, the pure countercurrent is not required, and can then be fed to an effective value formation, or to another process.

In this development, the fact is exploited, in that, if the demagnetization sequence according to the invention is run through alternately and cyclically with positive and negative saturation, the same residual current but with opposite sign is left over due to the symmetry of the magnetization curve after the two demagnetization sequences. More specifically, a rectangular magnetization alternating current with cycle frequency fz, which is superimposed on the countercurrent produced by the residual current, appears in the chronological course of the secondary current. Its amplitude can be determined, for example, in a simple manner by a correlation of the secondary current with a cycle frequency and cycle synchronous sine signal.

According to an embodiment of the invention, a measured signal for further processing is adjusted such that time intervals in the measured signal that correspond to a time interval of the predetermined pulse sequence are provided with a predetermined constant value, in particular with the value zero.

In this advantageous embodiment, the achievable intrinsic accuracy is increased as the effects, arising from the prescribed characteristic of the pulses, do not contribute to the measurement of the interesting countercurrent but are actually rather disturbing and are largely removed.

The adjusted measured signal can be multiplied with a window function, in particular a cyclically frequent and cyclically synchronous sinusoidal signal.

Thereby, steep edges can be reduced or avoided advantageously in the measurement signal and the amplitude of high-order harmonics can be reduced to a small value, which usually brings substantial simplification in the analysis of the measurement of the mixed current.

According to another advantageous development, the magnitude of the generated negative ohmic resistance is controlled based on a determined incomplete compensation or over-compensation of the ohmic resistance of the secondary coil.

Thus, even small changes in the magnetic flux over time, but which can cause a significant deviation from the magnetization current present upon activation of the resistance compensation, are detected and taken into account in the calculation of the differential direct current of interest. The reliability of the method is therefore still increased even if resistance compensation is not working exactly in practice; a constant magnetization current is still obtained.

Preferably, an incomplete compensation or overcompensation of the ohmic resistance of the secondary coil is determined in that the amplitude of a harmonic is determined from the measurement signal, which occurs in the case of deviation of a rectangular magnetization alternating current from a rectangular signal form.

Thus, a processing and calculation of the measurement result by a processor is particularly favored.

The current to be measured can now be determined advantageously from the measurement signal and the incomplete compensation or overcompensation determined.

According to yet another advantageous embodiment of the invention, an offset voltage occurring in a secondary circuit, particularly caused by used electronic components is detected and subsequently compensated.

This makes it possible to compensate for the temperature dependence, and manufacturing tolerances of the electronic components of the device according to the invention, and precise processing is allowed for and facilitated:

thus, the secondary circuit is formed by the coil, and various electronic circuits, whereby it is required by these circuits that they can process direct current signals accurately. If a secondary current flows through the dipole, it is required that this forms a voltage drop proportional to the secondary current, which inter alia means that the voltage drop is equal to zero in the case that the secondary current is zero. An accurate direct current signal processing without a corresponding compensation often leads to problems, for example, due to tolerances or manufacturing tolerances and temperature dependencies of active electronic components. In operational amplifiers with which the circuits of the secondary circuit are advantageously realized, this problem manifests itself in the form of the offset voltage. This voltage varies from item to item and is temperature dependent. An offset voltage for the operational amplifiers of the dipole means that the current-proportional voltage drop across the dipole is superimposed to a small, undesirable direct current voltage. The voltage source and the current sensor also bring unwanted direct current voltages into the secondary circuit for the same reason. These are now compensated advantageously according to the invention.

It is preferred that the value of the offset voltage is determined by means of correlation, whereby the amplitude of a harmonic is determined from the measurement signal, which neither occurs in a rectangular signal nor a double saw-tooth shape.

Thus, the offset voltage can be determined in a convenient manner, for example, by means of a processor.

According to an advantageous embodiment, the solenoid is the secondary coil of the transformer for providing the predetermined pulse sequence via the transformer core.

Thus, the measurement of the mixed current with only one coil in addition to the primary current conductor can be achieved in a cost effective manner. The secondary coil is used both for generating the pulse sequence and for resistance compensation.

Alternatively, the invention is applied to a transformer with additional coils. In yet another embodiment, multiple current transformers with one or more windings are used, whereby the redundancy and safety are further increased advantageously. For example, another coil may be used according to the invention and which outputs the predetermined pulse sequence, whereas the secondary winding is used for measurements.

In one embodiment of the invention, the device comprises at least one controllable current source and at least one current meter that are connected to a controller.

Furthermore, the device has preferably a controller for resistance compensation and for adjusting the negative resistance value of the dipole in dependence on the temperature.

In a particularly advantageous embodiment, the controller is implemented with a microcontroller.

In doing so, the invention can be inexpensive and in addition made small and compact, since the processing is performed exclusively by software or firmware without the need for larger electronic modules.

The invention also provides a method for measuring electrical currents by means of a current transformer comprising the following steps of: extending the secondary circuit of the current transformer with an electrical device, so that an active dipole forming a negative ohmic resistance, and current detection in the secondary circuit of the transformer is connected in series, and a voltage source in the current circuit of a magnetic coil of the transformer is connected in series, and a control unit is connected with the current sensing and with the voltage source; reading of the current sensor, and controlling of the voltage source by means of the control unit, for executing the method according to the invention; and outputting a signal from the control unit, which includes the direct current component and the alternating current component of an electric primary current of the transformer.

The invention can be used in all technical fields of application in which mixed currents are measured. However, it is particularly suitable for the measurement of differential currents or residual currents in an electrical device that contains an alternating current component besides a direct current component. However, this is not intended to restrict the scope of the invention.

DRAWINGS

In the following passage, the invention is described in detail with reference to the accompanying drawings. In the drawings.

DETAILED DESCRIPTION

Figure 1:
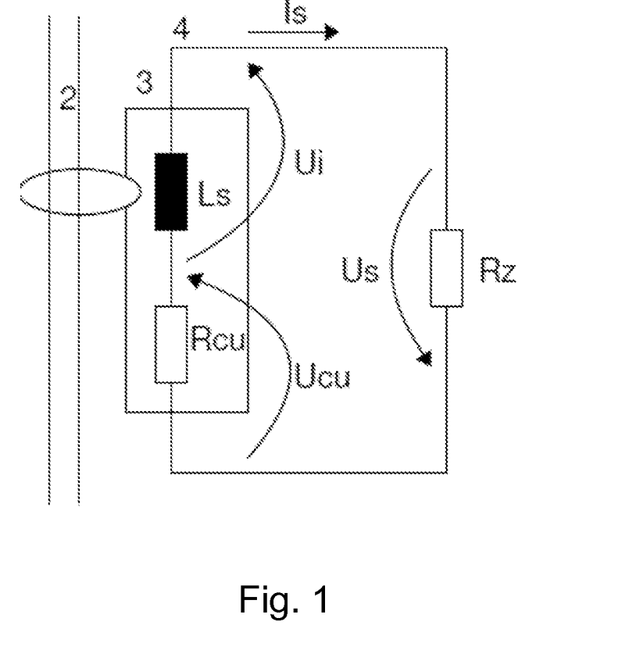
FIG. 1 is a circuit diagram of a current transformer in conjunction with the resistance compensation according to the invention.

In FIG. 1 the circuit diagram of a current transformer according to the invention is shown with the resistance compensation in accordance with an embodiment of the invention. The coil 3 has a coil inductance Ls and a coil resistance Rcu. The current transformer monitors the primary conductor 2 for the presence of a differential current. The secondary current Is flows in the secondary circuit 4. The voltage drop Us of the coil is composed of the induction voltage Ui and the voltage drop Ucu over the ohmic coil resistance. For the differential current measurement by means of the current transformer in the secondary circuit 4, the ohmic coil resistance Rcu of the coil 3 is compensated by means of an active dipole forming the negative ohmic resistor Rz. In this way, a direct current component of a secondary current Is induced by a primary current 2 is maintained in the coil 3.

According to Kirchhoff's second law, it applies for the sum of all partial voltages in FIG. 1:

$$0=Ui+Ucu+Us$$

$$0=Ui+Rcu \cdot Is+Rz \cdot Is \quad (1)$$

In this case, the induction voltage Ui is the voltage induced in the coil, Us the coil voltage and Is the secondary current. Due to the resistance compensation Rz=−Rcu. Therefore, it follows:

$$0=Ui \quad (2)$$

The induced voltage is thus zero and independent of the secondary current. From the law of induction, it then follows for the time variation of the magnetic flux ϕ linked with the coil:

$$-\frac{d\phi}{dt}=Ui=0 \quad (3)$$

The magnetic flux passing through the coil is thus held constant irrespective of the secondary current Is, and thus also independent of the residual current. In turn, if the magnetic flux is constant, the sum of the magnetic voltages generated across the core must be constant. It follows that any change in the residual current opposes a proportional change of the secondary current Is. In the special case that the magnetic flux is zero, the result is the same conditions as on the compensation Hall current transformer. Each differential current, and direct current in particular, causes a proportional countercurrent through the coil.

Figure 2:
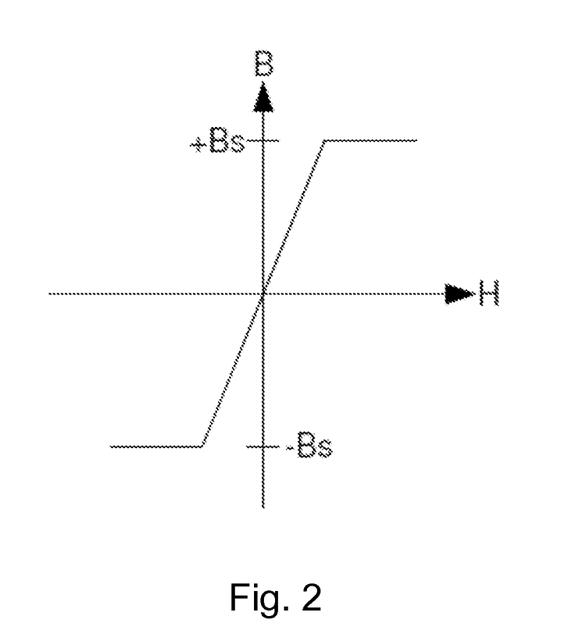
FIG. 2 is an idealized magnetization curve.

FIG. 2 shows an idealized known magnetization curve without the hysteresis with an ideal saturation. The core material inside is free of remanence and has constant permeability between the two saturation flux densities. Upon reaching saturation, the permeability jumps to zero. This magnetization curve is based on the time characteristics presented below.

A demagnetization sequence is run through, so that a defined magnetic flux is established in the transformer core. For this, a predetermined pulse sequence is given through the transformer core during each demagnetization sequence. In this pulse sequence, the transformer core is magnetized by applying a voltage pulse or a current to the coil of the transformer up to the saturation flux. The magnetic flux is then reduced again by applying a second voltage pulse of opposite polarity and defined voltage-time area of the magnetic flux.

A simple example of a cycle time according to the invention with symmetrical periodic demagnetization sequences with demagnetization time te and measurement sequences with measurement time tm is described below with reference to FIG. 3 and FIG. 4. In the present detailed description, the simple representation is initially assumed for an idealized magnetization curve B(H), as shown in FIG. 2. Here, the core material is free of remanence and has constant permeability between the two saturation flux densities Bs. Upon reaching the saturation Bs, the permeability jumps to zero.

Figure 3:
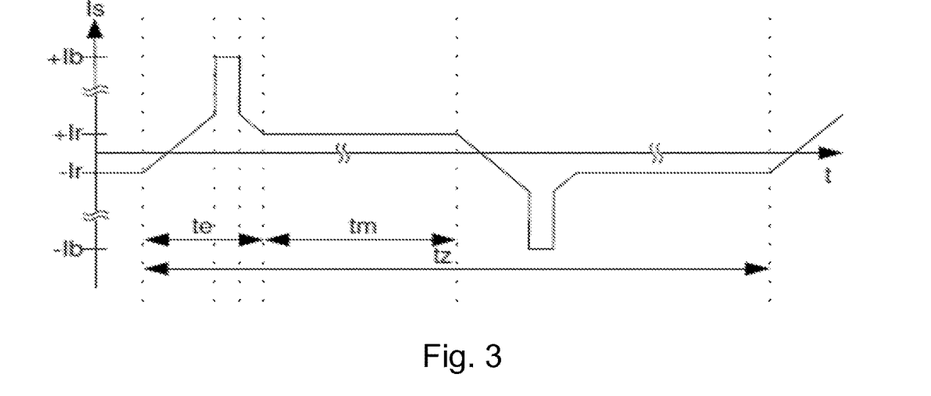
FIG. 3 shows a current-time diagram of the characteristic of a secondary voltage through a measuring cycle in accordance with an embodiment of the invention shown in FIG. 3.
Figure 4:
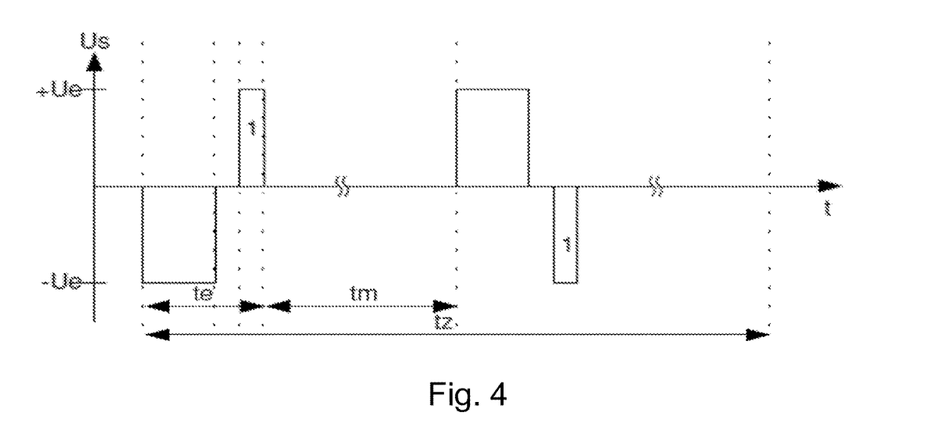
FIG. 4 shows a voltage-time diagram of the characteristic of a coil voltage across a measurement cycle according to the embodiment shown in FIG. 3.

FIG. 3 depicts the characteristic of the secondary current (Is) via a complete measurement cycle of the cycle time r tz, consisting of the demagnetization sequences of the demagnetization time te and the measurement intervals of the measurement time tm in between is shown. FIG. 4 shows the variation of the coil voltage Us across a measurement cycle. The differential current, and thus the countercurrent flow are assumed to be zero, so that the secondary current and magnetization current are equal. Due to the simplicity of illustration, the idealized magnetization curve of FIG. 2 is based on the characteristics.

The positive demagnetization sequence, wherein the core is saturated with a positive secondary current, starts with the application of the first voltage pulse 44 with a negative demagnetization voltage Ue to the coil. Starting from the residual negative current Ir, the secondary current increases linearly. If the saturation flux in the transformer core is reached, the inductance of the coil is equal to zero. The secondary current rises suddenly up to a maximum value +Ib, which is specified by an electronic current limit. The coil voltage drops sharply due to the lack of self-induction from −Ue to zero. During the following further voltage pulse with positive demagnetization voltage +Ue and defined voltage-time area 1, the secondary current decreases linearly until the positive residual current +Ir. The resistance compensation keeps the secondary current at the value +Ir constant in the next measurement interval with sampling time tz. The negative demagnetization sequence follows, which begins by applying the first voltage pulse 44 with positive demagnetization voltage +Ue with +Ir and ends with −Ir.

The demagnetization sequence can be adapted once to the current transformer type being used. Given the demagnetization voltage Ue, the duration of the first and second voltage pulse is to be determined here. The following reference values have proven to be a rule of thumb for pulse times:

$$t_1 = \frac{2\phi_S}{Ue} \qquad (4)$$

$$t_2 = \frac{\phi_S}{2 \cdot Ue}$$

Here, t1 is the duration of the first voltage pulse, t2 is the duration of the second voltage pulse, and $\phi s$ the saturation flux of the current transformer. The saturation flux depends on the core material, number of turns and core cross-section (iron cross-section) and can be determined electronically.

In the above description of the demagnetization sequence, the idealized magnetization curve of the core in FIG. 2 was used for ease of illustration. In practice, the soft magnetic core materials finding application for the differential current transformer have a certain coercive force. This fact has an effect on the characteristic of the magnetization current during the demagnetization sequence. If the magnetic flux in the transformer core passes through the value zero, the magnetization current is not equal to zero as shown in FIG. 2, but corresponds to the coercive current. A portion of the coercive current is also included in the residual current that remains at the end of demagnetization sequence. The residual current therefore depends not only on the voltage-time area of the demagnetization sequence but also on the coercive current of the respective current transformer. In addition to the core material also the length (iron path) of the transformer core has influence on the coercive current. Because of the length dependence, for example, current transformers with a large diameter often have greater coercive currents than small current transformers. If the typical transformer coercive current significantly (factor 2) lies above the desired residual current, the desired residual current can solely be adjusted via the voltage-time area of the demagnetization sequence only by choosing a residual magnetic flux close to the saturation flux. Since the rise dB/dH of the magnetization curve in this area is already reduced, a low differential inductance of the coil is available in the measurement interval after the demagnetization sequence. This, in turn, leads to a faster drop of a secondary direct current if the resistance compensation is not exact. In the formula Is(t), the differential inductance is included as Ls. A smaller coil inductance Ls results in a smaller time constant T for a total ohmic resistance Rg in the secondary circuit unequal to zero. Therefore, it is desirable that the residual magnetic flux for the desired residual current is much smaller than the saturation flux, that is, located in the region of a sharp increase in the magnetization curve.

Figure 5:
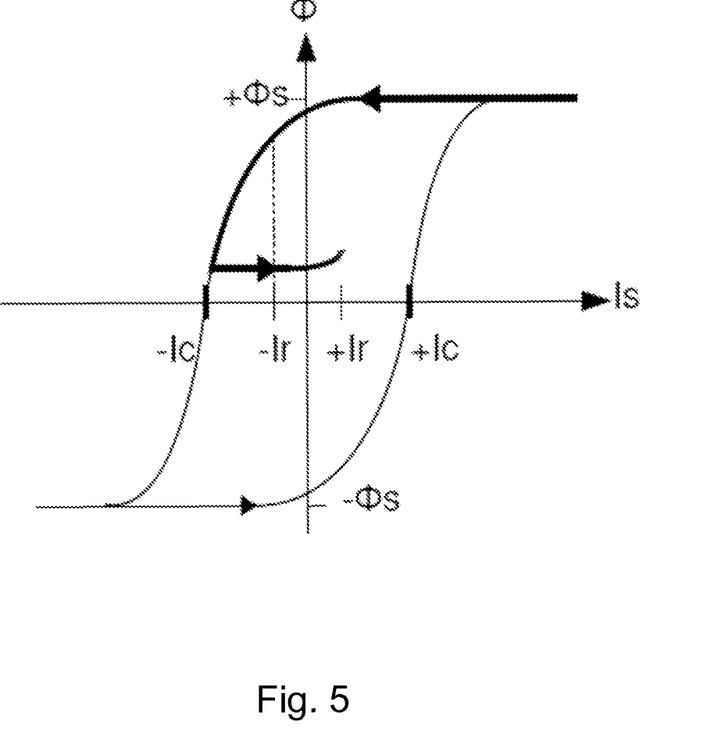
FIG. 5 shows a magnetization curve with remanence, with the pulse sequence in accordance with another embodiment of the invention.

In an embodiment of the invention, therefore, the demagnetization sequence is extended by a third voltage pulse, which is applied to the coil with an opposite voltage polarity to the second voltage pulse. In FIG. 5 the full magnetization curve of a current transformer is sketched. Here, $\phi$ is the magnetic flux linked with the coil and Is the secondary current. After the first voltage pulse of demagnetization sequence, the core is saturated with the saturation flux +$\phi$s. During the second voltage pulse, the magnetic flux $\phi$ of the transformer core follows the characteristic of the highlighted curve path. In a magnetic flux just below +$\phi$s the secondary current has already reached the value of the residual current −Ir. If the voltage pulse would end here, although the desired residual current would be set, the core would remain in an area with low curve gradient dφ/dIs and the differential inductance would be low. If the voltage pulse lasts until φ=0 is reached, the transformer core remains in an area with a large curve gradient, but the secondary flow is almost as high as the coercive current −Ic. Through the third voltage pulse, which is short compared to the first and the second voltage pulse, the high secondary current is reduced, whereby the magnetic flux in the transformer core increases only insignificantly. The curve branches from the full magnetization curve and ends at residual current +Ir. The demagnetization sequence with three voltage pulses thus provides an optimum setting of residual current and residual magnetic flux.

Figure 6:
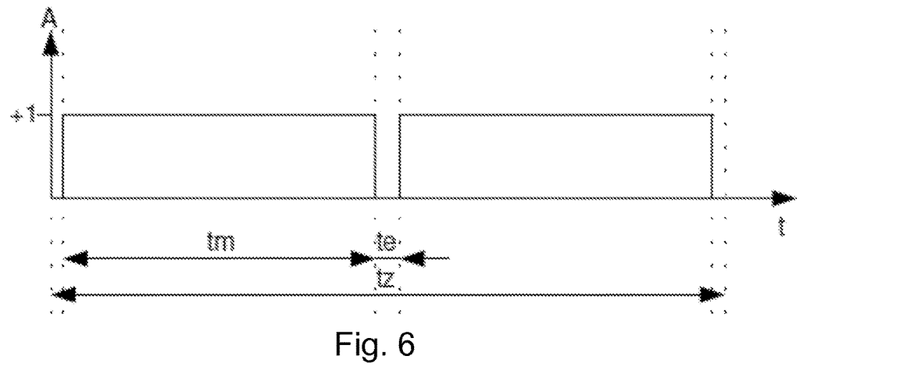
FIG. 6 shows the time characteristic of a rectangular cutout signal according to an embodiment of the invention.

In another embodiment, no counter flow and therefore no differential current is determined during the demagnetization sequence, thus during demagnetization time te, so that the time characteristic of the measurement signal obtained from the secondary current, so that relative to the actual characteristic, the residual current has cyclic gaps. For further processing, these gaps are filled with the instantaneous value zero. Mathematically, this corresponds to a multiplication of the differential current characteristic with a rectangular cutout signal, as shown in FIG. 6.

Figure 7:
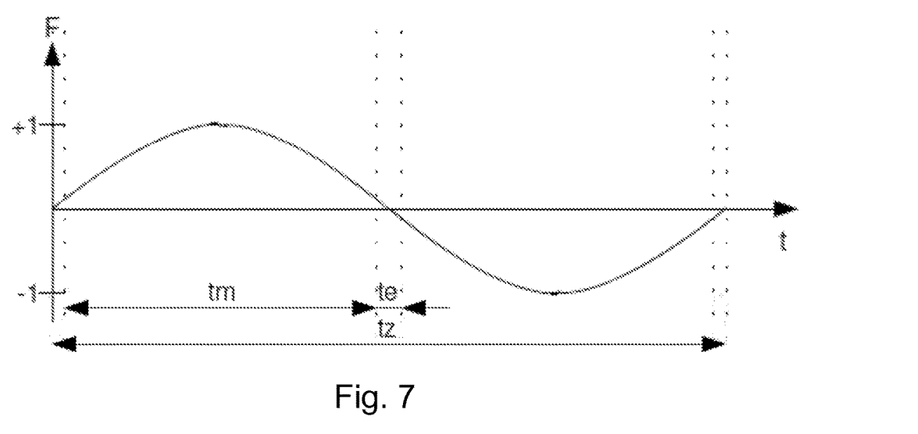
FIG. 7 shows the time characteristic of a cycle and cyclic frequency synchronous window function according to the embodiment shown in FIG. 6.

Further, the discontinuous measurement signal is multiplied by a cyclically frequent and a cyclically synchronous sinusoidal signal prior to further processing according to FIG. 7. The product from the above cutout signal and the sinusoidal window function is a discontinuous sinusoidal signal in the zero crossings according to FIG. 8.

Figure 9:
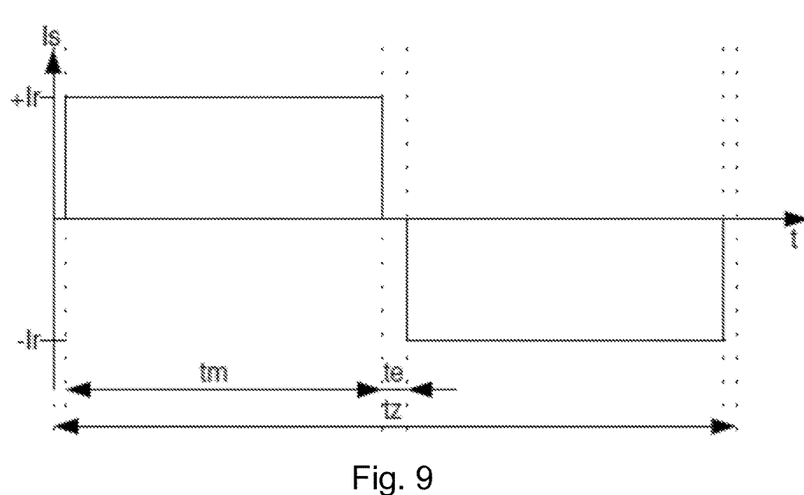
FIG. 9 is a current-time diagram of the secondary current at exact resistance and offset compensation, wherein the countercurrent is assumed to be zero in accordance with an embodiment of the invention.

FIG. 9 shows the rectangular magnetization alternating current which is caused by the cyclic demagnetization sequences with alternating polarity of saturation flux. The countercurrent is assumed to be zero for the display, so that the secondary current and the magnetization current are equal. The characteristic of the secondary current Is during demagnetization sequences is not shown. The resulting gaps are filled with the current value of zero. The demagnetization time is te, tm the measurement time, tz the cycle time and Ir the residual current.

In yet another embodiment of the invention, the method is carried out with the aid of a microprocessor which harmonically disintegrates the signals and evaluates them by means of Fourier analysis.

In the text below, reference is made to the harmonics of the rectangular-wave magnetization alternating current according to FIG. 9. Such a rectangular signal with gaps has the following coefficients for the cosine (Cn) and sine elements (Sn) of the Fourier series.

$$Cn = 0 \quad (5)$$

$Sn = 0$ for $n$ even numbers $$Sn = \frac{4}{\pi n} \cdot \cos(n \cdot b) \text{ for } n \text{ odd numbers with } b = \frac{te}{tz} \cdot \pi$$

Where n is a multiple of the cycle frequency, b is the half width of the gap in radians. These and all other Fourier series in the text are normalized to a signal amplitude of one, and a period of 2π.

In the measurement signal, however, also undesired frequencies are present, resulting from the rectangular cutout signal with gaps shown in FIG. 6. More specifically, the undesired frequencies are present, since the current characteristic of the demagnetization sequence was replaced by zeroes, whereby, mathematically, the replacement is equivalent to multiplying the secondary current characteristic with rectangle and analytically the rectangle consists of many frequencies.

Each frequency component of the signal is multiplied with all frequency components of residual current, whereby summation and differential frequencies occur. The extent to which undesired frequency components occur depends on the frequency spectrum of the cutout signal. Its Fourier series has the following coefficients for the cosine Cn and sine Sn terms. The cutout signal has the following Fourier coefficients:

$$C_0 = 1 - \frac{2b}{\pi} \quad (6)$$

$$Cn = -\frac{4}{\pi n} \cdot \sin(n \cdot b) \text{ for } n \text{ even numbers}$$

$Cn = 0$ for $n$ odd numbers $$Sn = 0 \text{ with } b = \frac{te}{tz} \cdot \pi$$

Where n is a multiple of the cycle frequency, and b is half the width of the gap obtained in radians during the duration of a cycle (cycle time, tz).

Small coefficients are then obtained when b is small. The smaller b, the more the cutout signal resembles the continuous single signal, which, when multiplied has no effect on the measurement signal. Through the demagnetization voltage that is limited in practice, the demagnetization time to cannot be arbitrarily small. A small b presupposes a high cycle time. A high cycle time is then possible when the time change of the magnetization current during the measurement interval is small even with a high residual direct current. A possibly exact resistance compensation, which keeps the magnetic flux constant for a long duration, is therefore a prerequisite for a small share of undesired frequencies in the measurement signal.

Figure 8:
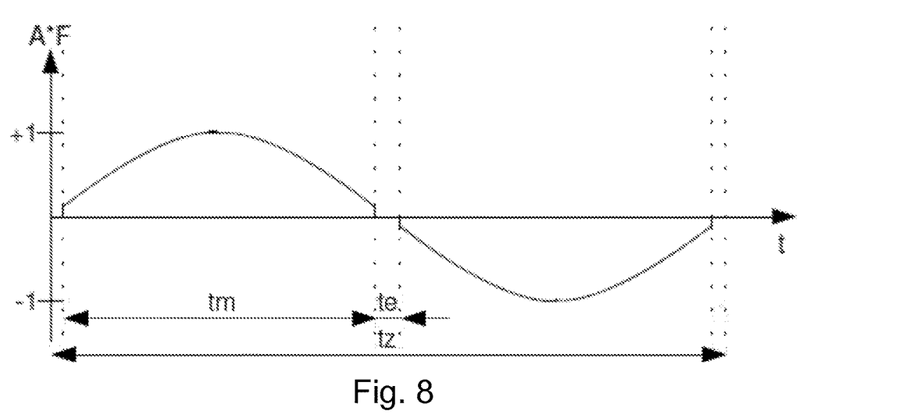
FIG. 8 is a gap sinusoidal signal according to the embodiment shown in FIG. 6 and FIG. 7.

The undesirable frequency components can be reduced further still by using the window function shown in FIG. 7. Thus, the discontinuous sine signal shown in FIG. 8 has the following Fourier coefficients.

$$Cn = 0 \quad (7)$$

$$Sn = 0 \text{ for } n \text{ even numbers } S_1 = 1 - \frac{2}{\pi} \cdot \left(b - \frac{1}{2} \cdot \sin(2b)\right)$$

$$Sn = -\frac{4}{\pi(1 - n^2)} \cdot (n \cdot \sin(b) \cdot \cos(n \cdot b) - \cos(b) \cdot \sin(n \cdot b))$$

for $n$ odd numbers

Figure 10:
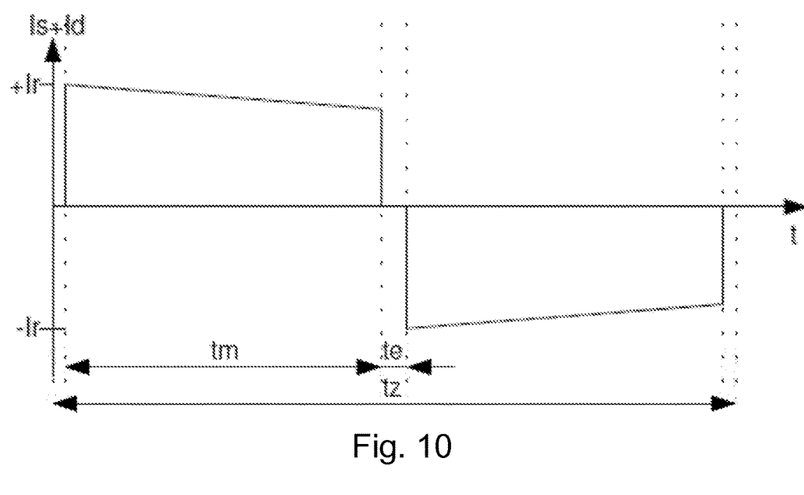
FIG. 10 shows a current-time diagram of the secondary current at spurious compensation of the coil resistance according to an embodiment of the invention.

To sustain possibly accurate resistance compensation, changes in the temperature-dependent coil resistance are continuously detected and compensated according to another embodiment of the invention. The demagnetization sequence is therefore designed according to the invention such that a sufficiently high residual current remains in the secondary circuit. This causes the ideal rectangular secondary current path described above, as shown in FIG. 9, in which, in turn, the countercurrent is assumed to be zero. The secondary current of the demagnetization sequence is not shown. The secondary current results in voltage drops across the coil resistance of the coil and the negative dipole resistor during the measurement interval. In case of spurious compensation the sum of voltages is equal to zero, resulting in a magnetic flux change, and thus a change of the secondary current. In case of over-compensation, that is, a too large amount of the negative resistance, the secondary current increases. In case of an incomplete compensation or under-compensation, it drops. The resulting characteristic is shown in FIG. 10 which is considered as the sum of the original rectangular secondary current from FIG. 9, and the double saw-tooth signal shown in FIG. 11.

Figure 11:
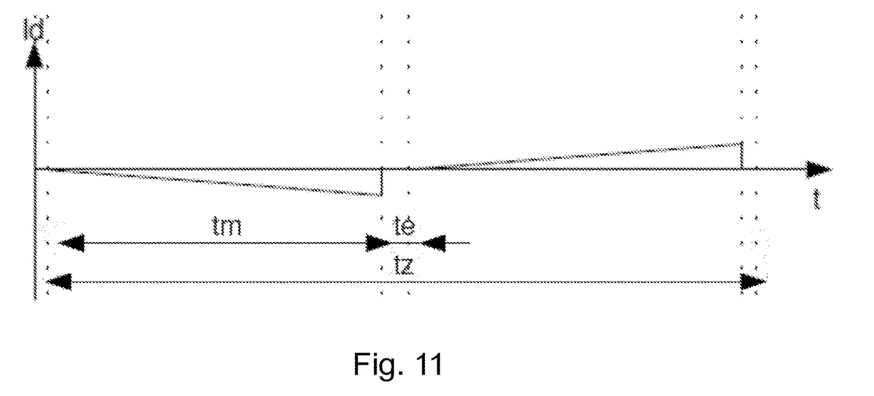
FIG. 11 shows a current-time chart of a double saw-tooth-shaped signal at spurious compensation of the coil resistance according to an embodiment shown in FIG. 10.

The presence and polarity of a corresponding double saw-tooth fraction again can be determined by a correlation. The fact is utilized that the Fourier series has such double saw-tooth signal cosine components that are not included in a rectangular signal shown in FIG. 9. A double saw-tooth signal in the form of FIG. 11 has the following Fourier coefficients:

$$Cn = 0 \text{ for } n \text{ even numbers} \tag{8}$$

$$Cn = -\frac{2}{\pi n} \cdot \sin(n \cdot b) + \frac{4}{\pi(\pi - 2b) \cdot n^2} \cdot \cos(n \cdot b)$$

for $n$ odd numbers $$Sn = 0 \text{ for } n \text{ even numbers}$$

$$Sn = -\frac{2}{\pi n} \cdot \cos(n \cdot b) \text{ for } n \text{ odd numbers}$$

Depending on the determined polarity of the C1 component, the negative resistance is increased or decreased, thereby regulating the resistance compensation.

For the calculation of the C1 component, the window function described above is preferably used. Because of $$\sin(x) \cdot \cos(y) = \tfrac{1}{2} \cdot (\sin(x+y) + \sin(x-y)) \tag{9}$$

with the multiplication of the measurement signal with the window function of the C1 component a sine wave signal S2 with double cycle frequency. It is then correlated accordingly.

To speak of a saw-tooth signal, i.e. a signal with a linear increase is a valid simplification since the amplitude of the double saw-tooth signal relative to the residual current is very small. According to equation (1) for Is(t) this corresponds to a very small t in relation to the time constant T, so that the characteristic of Is(0) can be approximated up to Is(t) as a straight line.

A target of the resistance compensation is to maintain the induction voltage Ui across the coil inductance Ls in FIG. 1 irrespective of the secondary current at zero value. With the use of operational amplifiers a direct current voltage can be superimposed on the measurement signal through their offset voltage. Based on the operational amplifier technology, here offset voltage (Uo) is the sum of all undesired direct current voltages in the secondary circuit. Now if an offset voltage occurs in the secondary circuit in accordance with Kirchhoff's second law, the induction voltage becomes equal to zero and corresponds to the offset voltage. This results in a time change of the magnetic flux and magnetization current and leads to measurement errors in the residual current. The magnetization current varies linearly with the velocity dI/dt=Ui/Ls.

A sufficiently small offset voltage Uo is offered by specially balanced precision operational amplifiers or Chopper amplifiers. Because of their low bandwidth, Chopper amplifiers cannot be used here. Precision operational amplifiers increase the cost of electronics, which is not in the sense of the task.

Figure 12:
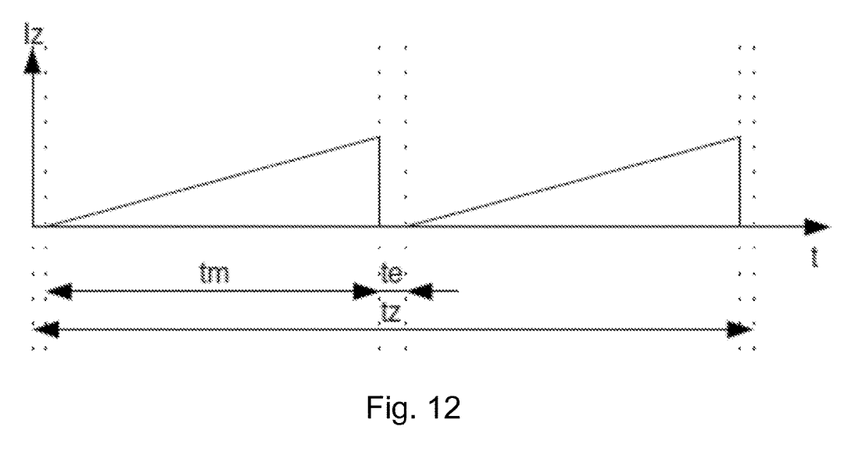
FIG. 12 shows a current-time diagram of a saw-tooth-shaped signal at spurious compensation of the offset voltage in accordance with an embodiment of the invention.

According to a particular embodiment of the invention, a further controllable voltage source—offset compensation 24—is therefore introduced in the secondary circuit. This offset voltage source 24 is controlled such that its voltage is opposite the offset voltage and is compensated so that the induced voltage is again equal to zero. To obtain this offset compensation as precisely as possible, changes in the temperature-dependent offset voltage must be detected and compensated continuously. With the exact offset compensation shown in FIG. 9 the rectangular secondary current characteristic occurs, wherein for the display in turn the countercurrent is assumed to be zero. In case of spurious compensation, a saw-tooth signal of FIG. 12 superimposes this rectangular characteristic. The presence and polarity of a corresponding saw-tooth-shaped signal in the measurement signal may be determined by correlation, because the saw-tooth signal S2 contains a harmonic of the frequency cycle that neither occurs in the magnetization alternating current nor in the double saw-tooth signal of the resistance compensation. The saw-tooth signal according to FIG. 12 has the following Fourier coefficients:

$$C_0 = \frac{1}{2} - \frac{2b}{\pi} \tag{10}$$

$$Cn = -\frac{2}{\pi n} \cdot \sin(n \cdot b) \text{ for } n \text{ even numbers}$$

$$Cn = 0 \text{ for } n \text{ odd numbers}$$

$$Sn = -\frac{2}{\pi n} \cdot \cos(n \cdot b) - \frac{4}{\pi(\pi - 2b)n^2} \text{ for } n \text{ even numbers}$$

$$Sn = 0 \text{ for } n \text{ odd numbers}$$

In dependence on the polarity of the detected S2 component in the measurement signal, the voltage of the controllable voltage source 24 is increased or decreased and thus the offset compensation is regulated.

Figure 13:
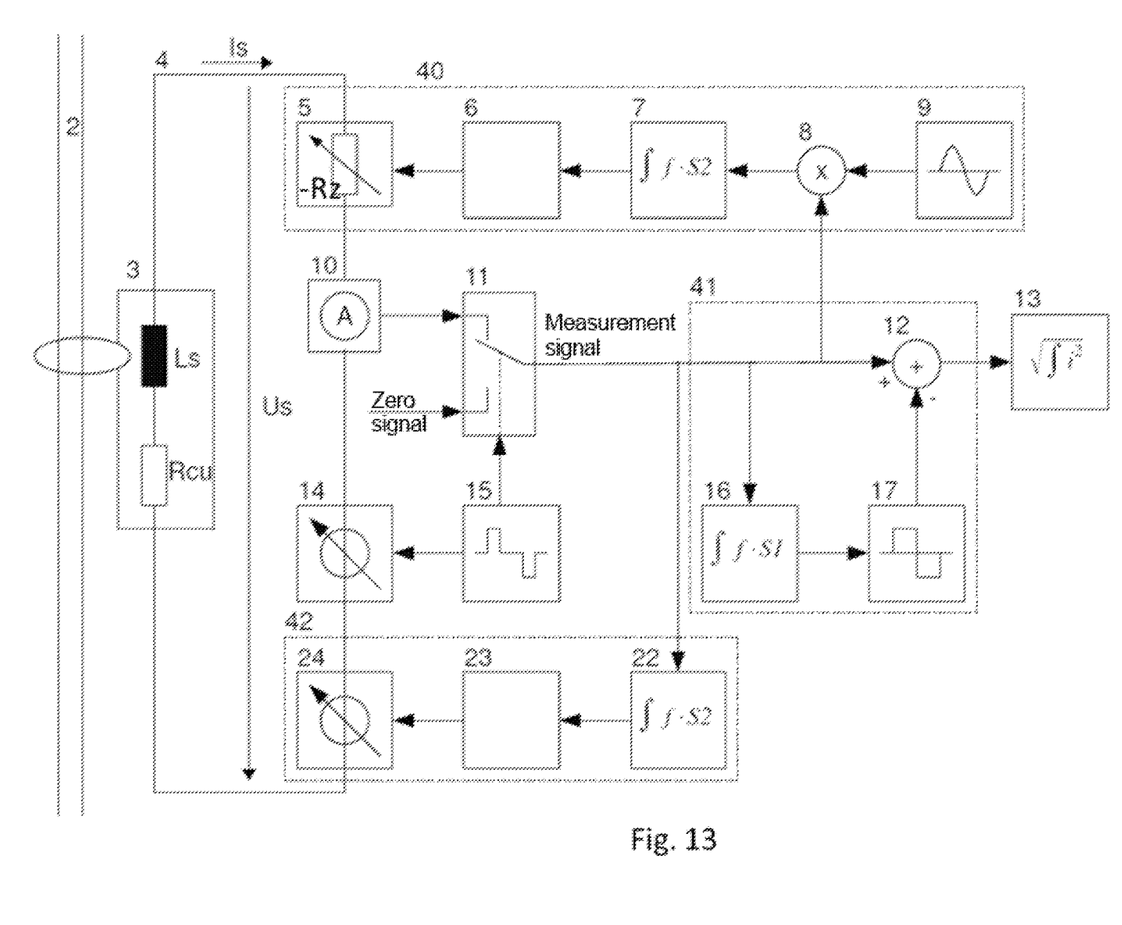
FIG. 13 is a block diagram of the device according to the invention for implementing the method according to one embodiment.

With reference to FIG. 13, an example of a device according to the invention and the signal flow is explained in more detail. FIG. 13 shows the block diagram of a device for implementing the method. In the embodiment shown here, the secondary circuit 4 of a series circuit of coil 3 comprises the negative dipole resistor Rz forming dipole 5, the current sensor 10 for the secondary current Is, a controllable voltage source demagnetization sequence 14, and a controllable voltage source 24 for offset compensation.

Current sensor 10 and changeover switch 11 produce the measured signal from the secondary current Is. The controller 15 of the demagnetization sequence controls the changeover switch 11 such that the measurement signal during the demagnetization time to corresponds to the zero signal and during the measurement time tm the output signal of the current detector 10.

Controller 15 generates the demagnetization sequences and controls the voltage introduced into the secondary circuit 4 via the input of the voltage source 14.

The measurement signal from the changeover switch 11 is fed to the effective value formation 13. The summer 12, correlator 16 of the residual current compensation 41 and rectangular generator 17 of the residual current compensation 41 remove the rectangular magnetization alternating current portion from the measurement signal. For this purpose, the measurement signal is also is applied to the correlator 16 of the residual current compensation 16, which over the amplitude of the fundamental harmonic S1 of the rectangular magnetization alternating current determines the amplitude of the rectangular magnetization alternating current. The determined amplitude is fed to the rectangular generator 17. This produces a cyclic frequency and synchronous rectangular signal with the amplitude given by the correlator 16 residual current compensation 41. The signal characteristic at the output of the rectangular generator 17 thus corresponds to the characteristic of the magnetization current in the measurement signal. The summer 12 subtracts from the measurement signal, the correction signal generated by the rectangular generator 17 in this way and feeds the result to the effective value calculation 13.

Window function generator 9, multiplier 8, saw-tooth correlator 7, controller 6 of the resistance compensation 40 and dipole 5 of the resistance compensation 40 are used to compensate for the coil resistance Rcu and the control of the resistance compensation. For this purpose, the inputs of the multiplier resistance combination 8 are supplied with the measurement signal and the cyclic frequency and synchronous sinusoidal signal from the resistance compensation generator 9, and thereby applying the window function to the measured signal. The product of the two signals is applied to the saw-tooth signal correlator 7. The saw-tooth signal correlator 7 determines the amplitude and polarity of the double saw-tooth signal in the measurement signal, via the amplitude of the harmonic S2 occurring in the multiplier 8 from the harmonics C1 in the measurement signal. Resistance compensation controller 6 controls the negative resistance of the dipole 5, such that the amplitude calculated by the saw-tooth signal correlator 7 becomes equal to zero, thus the negative resistance of the dipole 5 compensates the ohmic resistor Rcu of the secondary coil. Correlator 22, controller 23 and controllable voltage source 24 of the offset compensation 42 serve to compensate the offset voltage in the secondary circuit 4 and the control of this compensation. Correlator 22 determines the amplitude of the saw-tooth component in the measurement signal via the amplitude of harmonic S2 in the measurement signal. Controller 23 controls the controllable voltage source 24 such that the amplitude is equal to zero, that is, the offset voltage of the secondary circuit is compensated by the voltage of the controllable voltage source 24.

Figure 14:
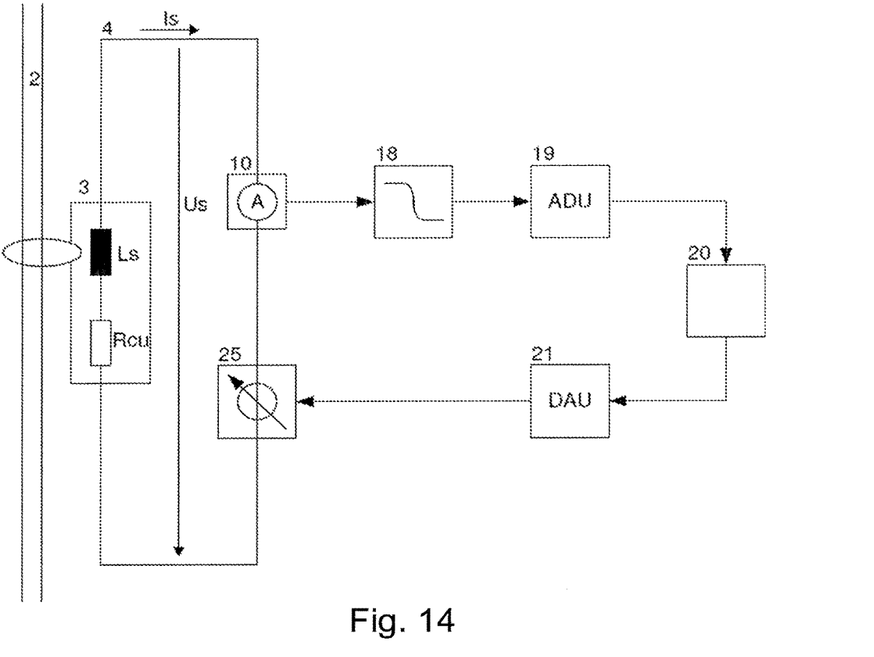
FIG. 14 shows a preferred embodiment of the device according to the invention.

FIG. 14 shows another very advantageous embodiment of the invention. The signal obtained with current sensor 10 is supplied via aliasing filter 18 and analog-to-digital converter 19 to the computer 20. The computer 20 controls voltage introduced into the secondary circuit 4 via the digital-to-analog converter 21 and voltage source 25.

During the measurement intervals, the computer 20 controls the voltage source 25 such that the series connection consisting of current sensor 10 and voltage source 25 forms the dipole with negative, ohmic resistance Rcu. The computer 20 generates also the demagnetization sequences and supplies the necessary voltages in the secondary circuit 4 via a voltage source 25. Moreover, it determines the residual current and regulates the resistance compensation and the offset compensation.

This embodiment can be used advantageously to determine the necessary parameters of the current transformer respectively used for the process. An initial value for the ohmic resistance is determined in that a direct-current voltage is introduced in the secondary circuit 4 via the voltage source 25 and the adjusting direct current is measured by the current sensor 10. Temperature-dependent changes to the ohmic resistance of the secondary coil are detected later, as described in the method, and the resistance compensation regulated.

Furthermore, the saturation flux is determined in that the computer 20 introduces a rectangular alternating current voltage in the secondary circuit 4 via voltage source 25. Here, the computer 20 always changes the voltage polarity when it detects sharp increase of the secondary current, which is typical for the saturation, by means of current sensor 10. Thus, the core oscillates back and forth between its two saturation fluxes. The saturation flux is then calculated from the periodic duration of the resulting oscillation and the amplitude of the alternating voltage.

An advantage of this embodiment is that the signal processing according to FIG. 13 required for the measurement method is realized broadly by software. The scope of electronics is low, resulting in low cost and is, therefore, very much in the sense of the task in question. The small space required for electronics facilitates the design of multi-channel devices for implementing the method, to which several current transformers can be connected. Multiple channels share the computer, power supply and communication electronics of such a device. The cost per monitoring channel decisive for the installed electrical equipment is further reduced.

Figure 15:
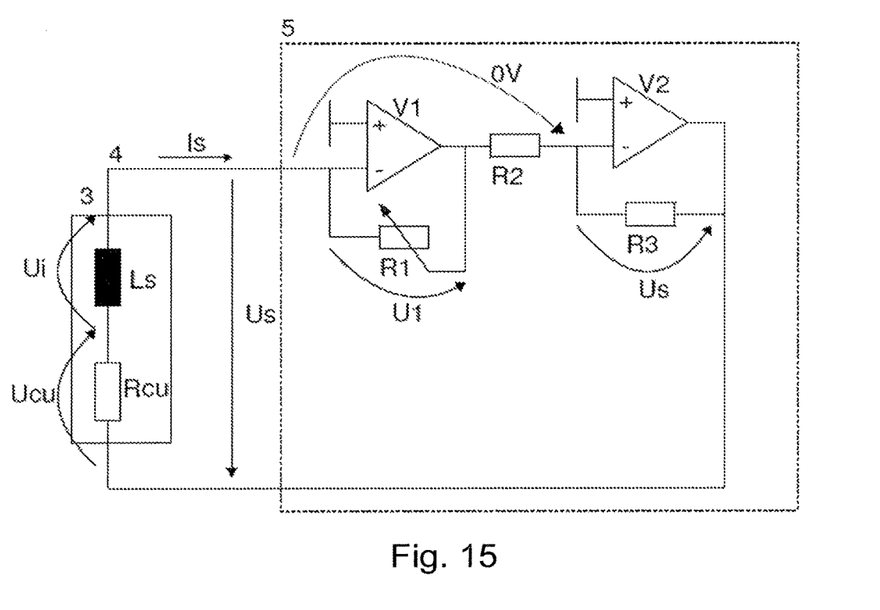
FIG. 15 is a detailed view of the resistance compensation according to the invention with an active dipole according to an embodiment of the invention.

In the following passage, possible equipment for resistance compensation with an active dipole is exemplified in detail with reference to FIG. 15. In the embodiment shown here, the secondary circuit 4 comprises a series connection of the secondary coil 3, the dipole 5 forming the negative dipole resistor Rz with amplifiers V1 and V2. Amplifier V1 operates as a current-to-voltage converter with the transmission factor F1=U1/Is=R1. V2 is connected as an inverting amplifier with F2=Us/U1=−R3/R2. For R2=R3 the transmission factor is obtained for the dipole F1*F2=−R1. Thus, if the depicted circuit is fed with a positive secondary current Is, a negative voltage drop Us=−R1*Is adjusts. The circuit forms a negative ohmic resistor.

For exact resistance compensation, the resistor R1 is set to the value Rcu. For any secondary current Is the coil inductance −Ui=Ucu+Us=0 occurs. With exact resistance compensation, the secondary circuit 4 does not allow an induced voltage Ui, thus no time-change in magnetic flux in the core. The smallest induction voltage on the total ohmic resistance of the secondary circuit, which is equal to zero, would immediately lead to a high secondary current which opposes the change in magnetic flux.

In yet another embodiment, long correlation times are used further, so that overall there is only a sluggish response to the correlation results. A small range of amplitude measurement is achieved in preference by correlation over many measurement cycles and by a low cycle frequency around 0.3 Hz. The frequency range in which a frequency component of the residual current can cause measurement errors, is narrow. It is also contemplated that sudden changes in the correlation result is evaluated as a fault, in which way the correlation results are discarded and, if necessary, the cycle frequency, and thus the sensitive frequency range is changed.

Through this it is achieved advantageously that the measuring method can be less disturbed by unfavorable frequency components of the differential current. This is of particular importance in the determination of the residual current and in the regulation of resistance compensation and in the control of the offset compensation, where the amplitudes of certain, cycle-synchronous frequency components in the measured signal are measured by correlation (S1, C1, S2). If the residual current contains these frequencies, measurement errors can occur in principle.

The fact that changes of the residual current and ohmic resistance that occur in the secondary coil due to temperature changes are slow processes, is therefore used according to this invention. Rapid changes in the correlation results therefore indicate a disturbing frequency component in the differential current.

One advantage is therefore that no interference voltage is induced in the conductors covered by the core. The multivibrator described in the prior art applies a rectangular, sharply rising alternating current voltage to the secondary coil. Although the multivibrator frequency is usually below 1 kHz, the harmonics extend up to about 150 kHz and are thus relevant for the assessment of the electromagnetic compatibility of the equipment.

SYMBOLS

A cutout signal
B magnetic flux density
Bs saturation flux density
Cn Fourier cosine coefficients
F window function
F1 transmission factor
F2 transmission factor
φ interlinked magnetic flux
φs saturation flux
H magnetic field strength
Ib maximum value of the secondary current
Ic coercive current
Id double saw-tooth signal
Ir residual current
Is secondary current
Is0 initial value of the secondary direct current
Iz saw-tooth signal
Ls coil inductance
R1 resistor
R2 resistor
R3 resistor
Rcu ohmic resistance
Rz dipole resistor
Sn Fourier sine coefficients
T time constant
U1 amplifier output voltage
Ucu voltage across the ohmic resistor
Ue demagnetization voltage
Ui induced voltage
Us coil voltage
b half width of the gap in radians
fz cycle frequency
n multiple of the cycle frequency
t time
t1 duration of the first voltage pulse
t2 duration of the second voltage pulse
te demagnetization time
tm measurement time
tz cycle time
Uo offset voltage
A rectangular cutout signal
Wie rectangular magnetization alternating current

REFERENCE 1 voltage-time area
2 primary conductor
3 secondary coil
4 secondary circuit
5 dipole
6 resistance compensation regulator
7 saw-tooth signal correlator
8 resistance compensation multiplier
9 window function generator
10 current sensor
11 changeover switch
12 summer of residual current compensation
13 effective value former
14 voltage source demagnetization sequence
15 control demagnetization sequence
16 residual current compensation correlator
17 rectangular generator
18 aliasing filter
19 analog-to-digital converter
20 computer
21 digital-to-analog converter
22 offset compensation correlator
23 offset compensation regulator
24 offset compensation voltage source
25 voltage source
V1 operational amplifier
V2 operational amplifier
R1 resistor
R2 resistor
R3 resistor
40 resistance compensation
41 residual current compensation
42 offset compensation
43 transformer core
44 voltage pulse

The invention claimed is:

1. A method of measuring electric currents by means of a current transformer, wherein
in a secondary circuit of the current transformer, ohmic resistance (Rcu) of a secondary coil is compensated by means of an active dipole forming a negative ohmic resistance (Rz) to sustain a direct current component of a secondary current (Is) induced in the secondary coil by a primary current,
for generation of a defined magnetic flux in a transformer core, a predetermined pulse sequence is passed through a solenoid coil to the transformer core, wherein the transformer core is magnetized by applying a first voltage pulse or a current to a coil of the current transformer up to a saturation flux (Φs), and
subsequently by applying a second voltage pulse of reversed polarity and defined voltage-time area the magnetic flux is reduced again, wherein a magnetization current in the secondary coil corresponding to a generated and defined magnetic flux is determined by generating a magnetization alternating current, in that the pulse sequence with a predetermined frequency and alternately with opposite sign is applied for both saturation polarities,
wherein the measurement signal is adjusted for further processing such that all time intervals (te) in the measurement signal, corresponding to a time interval of a voltage pulse of the predetermined pulse sequence of a polarity, are provided with a predetermined constant value, particularly with the value zero, and
wherein the adjusted measurement signal is further multiplied with a window function, in particular with cyclic frequency and synchronous sine wave signal.

2. The method according to claim 1, wherein said voltage-time-area of the second voltage pulse is selected and upon which following the second voltage pulse, a defined third voltage pulse is applied with an opposite polarity to the second voltage pulse, such that an operating point is achieved in the current transformer, wherein, with a magnetization current in relation to a saturation current, the differential inductance of the current transformer is as large as possible.

3. The method according to claim 1, wherein measuring cycles with a cycle time (tz) are formed, which in each period has a time interval with demagnetization time (te) and a time interval with measurement time (tm).

4. The method according to claim 1, wherein the amplitude of a resultant magnetization alternating current is calculated, and a correction signal is generated, which corresponds to a rectangular magnetization alternating current in characteristic and amplitude and a measurement signal is corrected according to the calculated correction signal.

5. The method according to claim 1, wherein the size of the generated negative ohmic resistor (Rz) on the basis of a detected incomplete compensation and/or overcompensation of the ohmic resistor (Rcu) of the secondary coil is regulated, wherein the incomplete compensation or overcompensation of the ohmic resistor (Rcu) of the secondary coil (3) is determined in that from the measurement signal the amplitude of a harmonic is determined, which occurs in case of deviation of a magnetization alternating current from a rectangular signal form.

6. The method according to claim 1, wherein an offset voltage occurring in the secondary circuit, caused in particular by using electronic components, is determined and subsequently compensated,
wherein the value of the offset voltage is determined by means of correlation by using the amplitude of a harmonic from the measurement signal, with which a simple saw-tooth signal (Iz) is differentiated against a double saw-tooth signal (Id) or rectangular signal.

7. The method according to claim 1, applied for the measurement of differential currents or residual currents in an electrical device, which contain a direct current component in addition to an alternating current component.

8. The method according to claim 1, wherein the solenoid coil for outputting the predetermined pulse sequence in the transformer core is the secondary coil of a converter.

9. A device for the measurement of electrical currents, for coupling with terminals of a transformer's secondary coil, and, in connection with the current transformer, adapted for carrying out a measuring process according to claim 1,
wherein the device comprises at least one controllable voltage source (25) and at least one current sensor (10) which are connected to a controller,
further comprising a second controller (6) for adjusting the negative dipole resistance (Rz) to the temperature-dependent ohmic coil resistance,
wherein the second controller is configured to carry out the adjustment of the negative dipole resistance (Rz) over the Fourier coefficients by means of the compensation of undesired frequency components of the measurement signal.

10. The device according to claim 9, comprising an active dipole, which is connected via a first regulator with the current sensor so that a control circuit for a defined frequency component of a measurement signal generated via the current sensor is formed.

11. The device according to claim 9, wherein the controller is implemented with a microcontroller.

12. A system for measuring electric currents, comprising an inductive current transformer and the device according to claim 9.

13. A method of measuring electric currents by means of a current transformer, comprising the steps of:
expanding a secondary circuit of a current transformer with an electrical device, so that an active dipole forming a negative ohmic resistor (Rz) and a current sensor in the secondary circuit of the current transformer are connected in series, and a voltage source in electric circuit of a secondary coil of the current transformer is connected in series, and a control unit is connected with the current sensor and the voltage source;
reading out the current sensor and controlling said voltage source by means of the control unit, for executing the method according to claim 1; and
outputting an output signal from the control unit that contains a direct current component and an alternating current component of an electric primary current of the converter.

* * * * *